United States Patent [19]
Fisch

[11] Patent Number: 4,552,826
[45] Date of Patent: Nov. 12, 1985

[54] METHOD OF FORMING COMPOSITE IMAGE AS IN ADD-ON NON-SILVER MICROFICHE

[75] Inventor: Richard S. Fisch, St. Paul, Minn.

[73] Assignee: Minnesota Mining and Manufacturing Company, St. Paul, Minn.

[21] Appl. No.: 541,527

[22] Filed: Oct. 13, 1983

[51] Int. Cl.$^4$ .................. G03C 5/08; G03C 5/18; G03F 7/26

[52] U.S. Cl. ........................................ 430/142; 430/8; 430/143; 430/148; 430/256; 430/257; 430/258; 430/261; 430/269; 430/292; 430/294

[58] Field of Search ............... 430/142, 143, 293, 294, 430/256, 257, 258, 261, 148, 292, 269, 8

[56] References Cited

U.S. PATENT DOCUMENTS

| | | | |
|---|---|---|---|
| 3,671,236 | 6/1972 | Van Beusekom | 430/143 |
| 3,681,074 | 8/1972 | Poot | 430/143 |
| 3,775,113 | 11/1973 | Bonham et al. | 430/293 |
| 4,242,439 | 12/1980 | Izu et al. | 430/346 |
| 4,260,673 | 4/1981 | Krech | 430/143 |
| 4,339,525 | 7/1982 | Bratt et al. | 430/293 |
| 4,355,095 | 10/1982 | Cousins | 430/293 |
| 4,379,827 | 4/1983 | Hallman | 430/8 |

FOREIGN PATENT DOCUMENTS 1468747  3/1977  United Kingdom .

Primary Examiner—Charles L. Bowers, Jr.
Attorney, Agent, or Firm—Donald M. Sell; James A. Smith; Lorraine R. Sherman

[57] ABSTRACT

A microform article useful for producing composite images has an image-forming layer separate from a photosensitive layer and allows for the subsequent addition, when needed, just prior to imaging, of a second photosensitive, resist layer for an add-on image. The unique construction and method therefor provide a positive or negative first image, with the possibility of either positive or negative additional images, the images not necessarily being in the same phase.

15 Claims, 8 Drawing Figures

METHOD OF FORMING COMPOSITE IMAGE AS IN ADD-ON NON-SILVER MICROFICHE

DESCRIPTION

1. Technical Field

This invention relates to a method for producing composite images, particularly microform images such as microfilm. In another aspect, an add-on, non-silver microfiche article is described.

2. Background Art

The present age is characterized by a proliferation of written communication. It frequently becomes desirable to reduce the size (bulk) of the data being accumulated as well as to update older data in an organized fashion.

One of the best available means to reduce the bulk of written data is the miniaturization of such data in a system known as file management. One form of file management utilizes microfilm which employs many diverse technologies to provide reduced sized images on film. These include both silver halide and alternative imaging techniques to silver halide. These alternative techniques may include those based on electrophotography, photopolymerization, and combinations of these or other imaging systems. Although silver halide microfilm has been available for years it is becoming more and more expensive because of the increasing cost of silver. Additionally, no viable route exists for the update or addition of new information to an already developed silver image.

Updateable non-silver imaging techniques have been suggested including those using electrophotography. While these do not use silver, and are therefore economic, they do not have the information capacity of the silver film. More recently, very high resolution imaging materials have become available through the union of thin film metal vacuum deposition and photosensitive resist (photopolymer) technology. These products are disclosed in British Patent Specification No. 1,468,747 and U.S. Pat. No. 4,242,439, wherein a film of an opaque material which may be a layer of a metal (e.g., aluminum, copper, nickel, bismuth) is overcoated with a light sensitive (UV) layer of a photoresist. Exposure to an image changes the photosolubility of the photoresist layer. In a subsequent development step a developer or etch bath removes the imaged portions of both the photoresist layer and the thin-metal vapor-deposited layer. Such materials as described in British Patent Specification No. 1,468,747 produce high resolution microfilm materials. Because the final images are of metal they are archival in nature, an especially appealing attribute of this kind of microfilm.

British Patent Specification No. 1,468,747, also describes a technique to update or add information onto the above-described article. A material based on a thin metal layer and a positive-acting photoresist is imaged with a first image in a subscribed area. The first image is developed and care is taken to keep the developer in the subscribed first image area and the unexposed portion of the material is kept in the dark until a second image is needed. The second image is then exposed in another subscribed area (which, as previously stated, had not been exposed) and that second subscribed area, only, developed. The technique as described has certain shortcomings, namely, (1) the unexposed area of the microfile material must be kept from light exposure since it is the source of the light sensitive media for additional exposure; this limits the viewing availability of the first images both for image copy or enlargement and storage conditions; and (2) since the unexposed area (the photosensitive material) is the source of future images it must also be protected from the developing action of the previous material recorded because that action will cause deterioration of the photosensitivity and therefore limit the practical ability of the technique.

Additionally, it is known in the art that the preferred photosensitive media used in British Patent Specification No. 1,468,747, the combination of a diazo oxide and phenol formaldehyde resin, is brittle and easily broken away during handling. The construction as described with such a positive-acting layer tends to become easily damaged during handling. Such brittleness causes broken areas in the surface of the photoresist which allow developer penetration to the metal and therefore unwanted removal of areas of the potential metal image. Such image layer degradation destroys the microimage fidelity.

SUMMARY OF THE INVENTION

The present invention overcomes the shortcomings of prior art add-on-microfilm constructions by allowing the microfilm article with its first image or its composite images to be handled immediately after development in any light of any intensity, even high illumination, and especially in a sunlight-filled, fully-illuminated room, without damaging the image. The construction of the present invention provides an image-forming layer separate from a photosensitive layer and the subsequent addition, when needed, just prior to imaging, of a second photosensitive, resist layer for the add-on image. The unique construction of the present invention provides a positive or negative first image, with the possibility of either positive or negative additional images, the images not necessarily being in the same phase.

The present invention provides a microform article comprising laminated first and second layered structures, a. said first layered structure comprising:
  (1) a flexible support,
  (2) said support having on at least one surface thereof an image-bearing vapor-deposited metal layer having a conductivity in the range of 0.28 to 1.20 ohms/cm$^2$ and a thickness in the range of 10 to 800 Å, preferably 50 to 350 Å, and most preferably 150 to 350 Å, and b. said second layered structure comprising in sequence
  (1) a negative- or positive-acting, non-silver-containing, photosensitive, resist layer,
  (2) a stripping layer, and
  (3) a flexible support;

said photosensitive resist layer of said second layered structure being laminated to said imaged layer of said first layered structure.

Before lamination of the first and second layered structures (but after imaging and development of the first layered structure), the first layered structure also contained a photosensitive, photoresist layer overlying the metal layer. Surprisingly, this photoresist layer served to protect the microimage during its handling and was not subject to deterioration with time. When an add-on image was needed, the initial photoresist was removed by aqueous or organic solvent and, subsequently, under safe-light conditions, a new photosensitive surface was laminated onto the original vapor deposited metal layer.

The second photosensitive layer serves to enable another image to be recorded on the old area (e.g., to void the first image), impossible with the construction of British Patent Specification No. 1,468,747, and/or a new image recorded onto a new surface area. In the case of either positive-acting or negative-acting material, this new photoresist on top of the first recorded information protects that information from deterioration during the subsequent add-on imaging and development steps.

The method of the present invention allows the add-on of both negative and positive images to the same microfilm. This is accomplished by laminating additional positive- or negative-acting photosensitive layers onto the positive- or negative-image-bearing, vapor-deposited metal layer, the images not necessarily being in the same phase.

In the present application:

"radiant energy" means electromagnetic radiation or particle beam energy;

"flexible support" means a nonmetal base sufficiently pliable so that it can be bent at a 90° angle without cracking or breaking.

DETAILED DESCRIPTION

Figure 1:
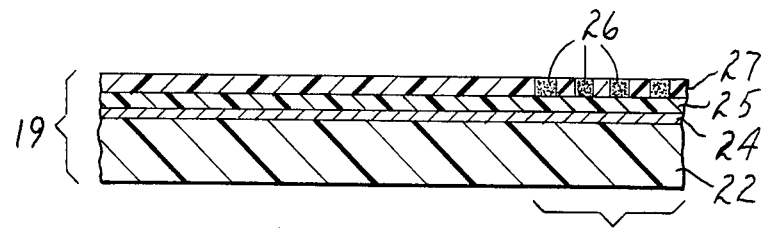
FIG. 1 is an enlarged schematic sectional view of a first layered structure of the invention after imaging, but prior to developing.
Figure 2:
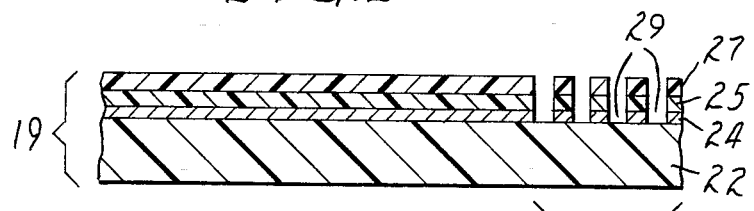
FIG. 2 is an enlarged schematic sectional view of the first layered structure of FIG. 1 after developing.
Figure 3:
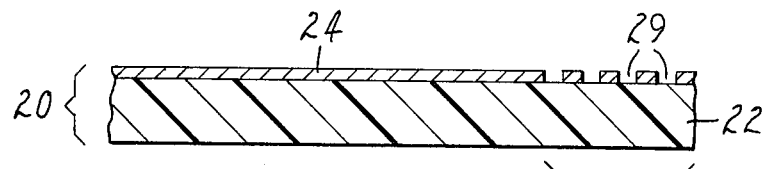
FIG. 3 is an enlarged schematic sectional view of the first layered structure of FIG. 2 after the remaining photoresist and optional layer have been washed away.
Figure 6:
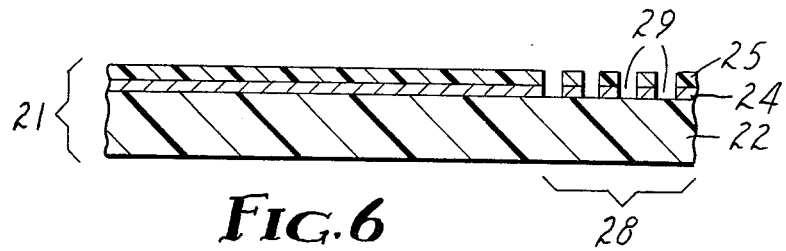
FIG. 6 is an enlarged schematic sectional view of the first layered structure of FIG. 2 after the remaining photoresist, but not the optional protective or priming layer, has been washed away.
Figure 7:
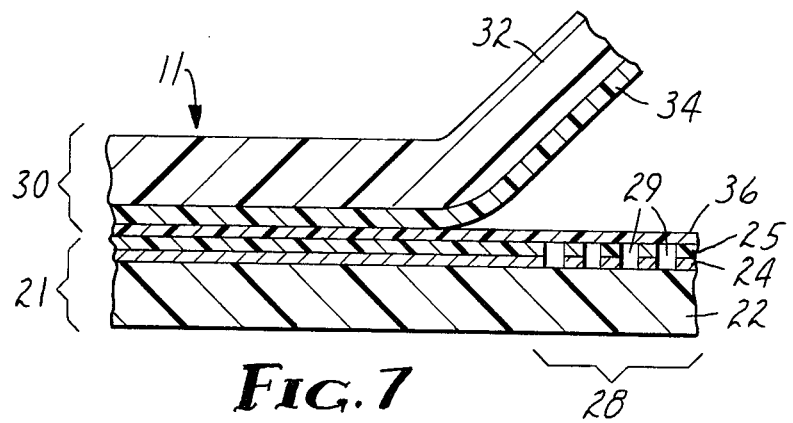
FIG. 7 is an enlarged schematic sectional view of a third embodiment of a microform article of the invention.
Figure 8:
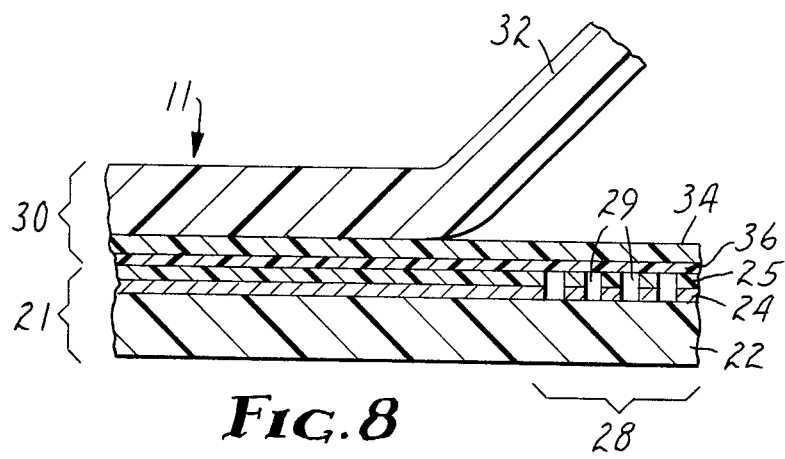
FIG. 8 is an enlarged schematic sectional view of a fourth embodiment of a microform article of the invention.

Referring to the Drawing, FIGS. 1 and 2 show one embodiment of an imaged, positive-acting, first layered structure 19 of microform article 10 (shown in FIGS. 4 and 5) of the invention. First layered structure 19 comprises support 22, which may be transparent, translucent, or opaque, vapor-deposited metal layer 24, an optional protective or priming layer 25, and photosensitive, photoresist layer 27. Imaged areas 26 of photoresist layer 27 in discrete area 28, are formed when the structure is imagewise exposed to radiant energy. Imaging can be through support 22, if the metal layer 24, the support layer 22, and the optional layer 25 are sufficiently transparent, or imaging can be through the photosensitive, photoresist layer 27. When first layered structure 19 is developed, imaged areas 26 in the photoresist layer 27 are dissolved away, thereby uncovering areas in optional protective or priming layer 25 immediately underlying the removed resist. Optional layer 25 is soluble in the developer solution and the uncovered areas likewise dissolve away. Due to this action of the developer solution, metal layer 24 becomes exposed to developer solution in the imaged areas and dissolution action takes place in these areas to provide open areas 29 in the resist, optional, and metal layers 27, 25, and 24 respectively. After development as just described, discrete area 28 consists of support 22, metal 24, and overlying resist 27 and protective layer 25 in unimaged portions of area 28. Subsequently, the remaining photoresist 27 and optional layer 25 are washed away using a suitable aqueous, medium pH solvent (i.e., pH of about 6 to 8) or an organic solvent providing first layered structure 20 comprising metal layer 24 on support 22 with imaged areas 29 as shown in FIG. 3. In the alternative, and as shown in FIGS. 6, 7 and 8, optional protective or priming layer 25, by appropriate choice of solvent, can be left as a protective layer on the remaining portions of metal layer 24 and not be washed away with remaining photoresist 27 to provide first layered structure 21. Subsequently, as shown particularly in FIGS. 7 and 8, when second layered structure 30 is laminated to first layered structure 21, optional layer 25 remains in the construction and a microform article of superior archival quality is provided. As mentioned above, if optional layer 25 is sufficiently transparent, imaging can take place through the protective layer.

Figure 4:
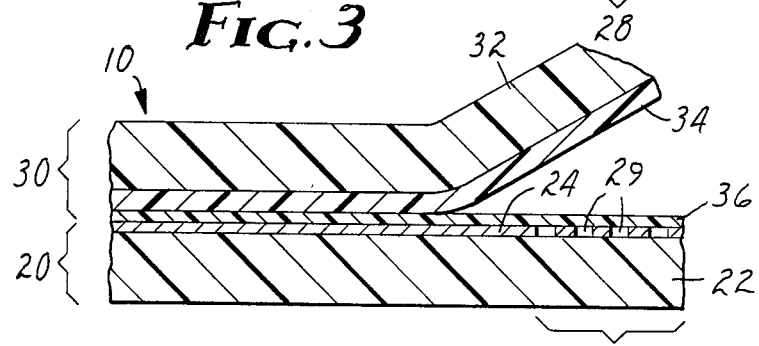
FIG. 4 is an enlarged schematic sectional view of one embodiment of a microform article of the invention.
Figure 5:
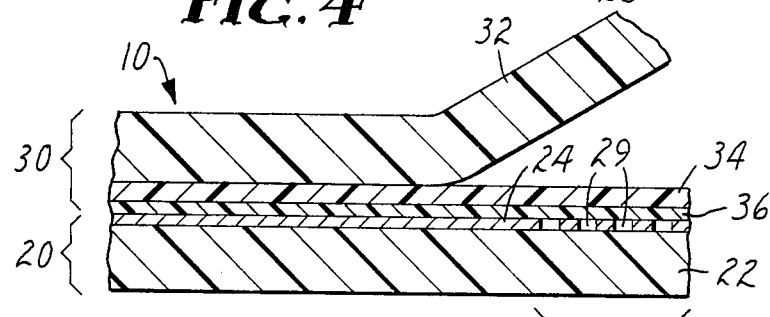
FIG. 5 is an enlarged schematic sectional view of a second embodiment of a microform article of the invention.

As can be seen in FIGS. 4 and 5 which show microform article 10 of the invention, second layered structure 30 comprises support 32, stripping layer 34, and laminable photosensitive resist layer 36. FIG. 4 shows stripping layer 34 adhering preferentially to support 32, rather than to resist 36, upon lamination of first and second layered structures and removal of support 32. In a second embodiment, as shown in FIG. 5, support 32 may be pulled away from stripping layer 34, which stripping layer 34 and resist 36 adhere to first layered structure 20. In the article of FIG. 5, stripping layer 34 may be washed away in a suitable solvent, such as an aqueous solution, prior to or subsequent to exposure and development of composite article 10. Imaging of second layered structure 30 may be through support 32 (prior to its removal) if it is transparent (support 32 may be transparent, translucent, or opaque) and through stripping layer 34 (if it is transparent), or directly through photosensitive, resist layer 36.

When a negative-acting resist is used, the exposing sequence is identical to that described above, however the image development sequence may involve additional steps as is known in the art.

The present invention provides a method for forming a composite image in an imaging material having a first and a second layered structure, said method comprising:

a. providing a first layered structure comprising:
1. a flexible support,
2. a vapor deposited metal image-bearing layer having a conductivity in the range of 0.28 to 1.20 ohms/cm$^2$, and a thickness in the range of 10 to 800 Å, preferably 50 to 350 Å, and most preferably 150 to 350 Å, on at least one surface of said substrate, and
3. a non-silver-containing positive- or negative-acting photosensitive, photoresist layer overlying said metal layer, b. imagewise exposing, in a discrete area of said first layered structure, said photosensitive, photoresist layer to radiant energy, c. developing said first layered structure in a sequence to provide an etched positive or negative image of archival quality, said image being protected by photoresist material, d. washing said imaged first layered structure with solvent to remove remaining photoresist material, e. providing a second layered structure comprising in sequence:
 1. a non-silver-containing positive- or negative-acting photosensitive resist layer,
 2. a stripping layer, and
 3. a flexible support, f. laminating said second photosensitive layered structure to said first imaged layered structure, said first imaged layer and said second photosensitive layer being adjacent to each other, g. optionally stripping said flexible support from said photosensitive resist layer of said second layered structure, h. imagewise exposing said second photosensitive resist layer, in a discrete area, to radiant energy, and i. developing said second photosensitive resist layer in sequence to provide a composite positive or negative etched image of archival quality, said image being protected by photoresist material,
said photosensitive, photoresist layers and said metal layer being soluble in said developer solution.

In the practice of the invention, the first layered structure (first imaging film) receives a first exposure in a discrete area. The photoresist layer is imaged as by exposure in a Scott Micrographic Printer, Model 716 (Scott Co., James Rivers, MA) for 4 sec., creating areas in the layer with different solubility properites. Radiant energy exposure either polymerizes or solubilizes the resist, depending upon whether the layer is negative- or positive-acting. The more soluble areas of the layer are then washed off using a developer sequence on the entire first layered structure, thereby exposing the metal coating beneath it. The metal coating is etched in the exposed areas, providing a negative or positive image corresponding to the original imaging exposure. In this manner, a positive or negative image of metal, having archival quality, is provided. This image is stable to light. Further, it resists abrasion due to the protection of resist and optional protective layer which remain on the metal image after development.

When it is desired to add-on another image, either superimposed on the first image or in an unimaged area, the protective photoresist is first washed off using a suitable aqueous, medium pH solvent, or an organic solvent such as a low molecular weight ($C_1$ to $C_4$) alcohol, e.g., methanol or a low molecular weight (up to 8 C's) ketone, e.g, methyl ethyl ketone. A second layered construction, as described above, is laminated, as by pressure, solvent, or heat, over the entire surface of the imaged article. The second photosensitive resist layer, which may be positive- or negative-acting, is adjacent the metal imaged layer (or its overlying protective layer, if present) of the first imaging film. After removal of the support (with or without the stripping layer attached), exposure and development as described by the technique above provides an article having composite images, which are dry, storable, and viewable under any condition, including bright sunlight, without degradation.

The support layers which can be used in the imaging materials of either the first or second layered structures in the method of the present invention advantageously are nonmetallic, flexible films which are transparent, translucent or opaque. Exemplary of such films are transparentized paper, polyethylene coated paper, polyethylene coated pigment filled (e.g., with ZnO) paper, cellulose acetates, glassine paper, polyethylene, polypropylene, polyethylene glycol terephthalate (Mylar TM), polycarbonates, polyvinyl chloride, polyamides such as nylon, polystyrene, polymethyl α-chloroacrylate and polyacrylonitrile. The thickness of the flexible films employed as the substrate is variable. Generally speaking, in the case of polymeric films, the thickness can range from about 25 microns to 250 microns, or more. The polymer of the support may contain fillers such as carbon black, titania, zinc oxide, dyes, pigments, and of course, those materials generally used in the formation of films such as coating aids, lubricants, antioxidants, ultraviolet radiation absorbers, surfactants, catalysts, slip agents, matte agents, antistatic materials, antihalation layers, and the like. These additives may be present in the range of 3 to 40 weight percent.

The vapor-desposited metal layer of the first layered structure may be any vapor-deposited metal or metalloid layer of very high transmission optical density, i.e., in the range of 0.8 to 3.0 or more. According to the practice of the present invention, the term metal layer is defined as a layer comprising metal, metal alloys, metal salts, and metal compounds. The corresponding meaning applies to the term metalloid layer. The term metal in metal layer is defined in the present invention to include semi-metals (i.e., metalloids), metal oxides and metal sulfides. Metals include materials such as aluminum, antimony, beryllium, bismuth, cadmium, chromium, cobalt, copper, gallium, germanium, gold, indium, iron, lead, magnesium, manganese, molybdenum, nickel, palladium, rhodium, selenium, silicon, silver, strontium, tellurium, tin, titanium, tungsten, vanadium, and zinc. Preferably the metal is selected from aluminum, chromium, nickel, tin, titanium and zinc. More preferably the metal is aluminum. Metal alloys such as aluminum-iron, aluminum-silver, bismuth-tin, and iron-cobalt alloys are included in the term metal layer and are particularly useful. Metal salts such as metal halides, metal carbonates, metal nitrates and the like are useful. Metal compounds such as metal oxide (see U.S. Pat. No. 4,387,156) and metal sulfides are of particular utility in imaging systems. Metal layers comprising mixtures of these materials such as mixtures of metal-metal oxides, metal-metal salts, and metal salts-metal oxides are also of particular interest. U.S. Pat. No. 4,364,995 teaches a method by which such coatings can be provided.

The thickness of the vapor-deposited metal layer depends upon the particular needs of the final product. In imaging constructions, for example, the thickness should be at least about 10 Å. Generally, the layer is no thicker than 800 Å, since thicker layers can require a long etching period. A more practical commercial range is between 50 and 350Å. A preferred range is between 150 and 350 Å.

It is preferred that the majority of the cross-section of the metal layer consist essentially of metal, metal alloys, metal salts and metal compounds. Traces of up to 10 percent or more of other materials may be tolerated generally in the layer, and in fact in certain processes of manufacture the boundary region of the metal layer and the protective layer may have a graded or gradual change from 100 percent metal to 100 percent organic material. But metal layers with the majority (at least 50 percent) of its cross-section consisting essentially of metals, metal alloys, metal salts, metal compounds and combinations thereof are preferred. The metal layer should have fewer than 100, preferably fewer than 50, and more preferably fewer than 30 detects per 177 mm$^2$.

Vapor-deposition of the metal layers may be accomplished by any means. Thermal evaporation of the metal, ion plating, radio frequency sputtering, A.C. sputtering, D.C. sputtering, and other known processes for deposition may be used in the practice of the present invention. The pressure may vary greatly during coating, but is usually in the range of $10^{-6}$ to $10^4$ torr.

The photoresist layer may be either a negative-acting or positive-acting photoresist as known in the art. Positive-acting photoresist systems ordinarily comprise polymeric binders containing positive-acting diazonium salts or resins such as those disclosed, for example, in U.S. Pat. Nos. 3,046,120, 3,469,902 and 3,210,239. Positive-acting photosensitizers are commercially available and are well reported in the literature. Negative-acting photosensitive resist systems ordinarily comprise a polymerizable composition which polymerizes in an imagewise fashion when irradiated, such as by exposure to light. These compositions are well reported in the literature and are widely commercially available. These compositions ordinarily comprise ethylenically- or polyethylenically-unsaturated photopolymerizable materials, although photosensitive epoxy systems are also known in the art. Preferably, ethylenically-unsaturated photopolymerizable systems are used, such as acrylate, methacrylate, acrylamide, and allyl systems. Acrylic and methacrylic polymerizable systems are most preferred according to the practice of the present invention. U.S. Pat. Nos. 3,639,185, 4,247,616, 4,249,011, 4,008,084, 4,138,262, 4,139,391, 4,158,079, 3,469,982, and U.K. Pat. No. 1,468,756, disclose photosensitive compositions generally useful in the practice of the present invention.

The preferred positive development process used in the practice of this application is one wherein the soluble photoresist is removed from the imaged photosensitive layer thereby exposing the metal image-forming layer beneath it to attack and dissolution by the developer. Preferably, the development is accomplished in one step through the use of a caustic bath at an elevated pH of 12.5 or above. To shorten the development time of this one-bath process additives have been reported including a chelating agent of a specific disassociation constant for the metal used as the image (see U.S. Pat. No. 4,314,022) or oxidizing agents such as periodates, perbromates, etc. have been added (see U.S. Pat. No. 4,098,712), or combinations thereof.

The negative- or positive-acting photosensitive resist layer can be developed out of water, water/alkali, water/alcohol (e.g., $H_2O$/n-propanol) or organic solvent (e.g., 1,1,2-trichloroethane) provided that the resist layer, upon being light-struck in some areas, becomes differentially soluble in the developer. The developer solution may contain a chelating agent selected for its interaction with the specific metal in the metal layer. Optionally, an oxidizing agent may also be included. The preferred developing solution is described in U.S. Pat. No. 4,314,022 and has a high caustic (alkali metal hydroxide) content, a pH of at least 12.5, preferably the pH is between 12.9 and 13.7 and most preferably between 13.1 and 13.4, and includes a chelating agent.

The preferred embodiment metal hydroxides useful in the developing solution are potassium and sodium hydroxide, but lithium, calcium and magnesium hydroxide, etc., may also be used alone or in combination with the other metal hydroxides. In the case of an aluminum metal layer the stability constant of the chelating agent for aluminum ion ($Al^{+3}$) must be greater or equal to 6.70. Useful chelating agents for aluminum vapor-coated substrates include ethylenediaminetetraacetic acid, diaminopropanoltetraacetic acid, and nitrilotriacetic acid. The concentration of the chelating agents should be at least 0.015 M, preferably 0.02 M, and most preferably at least 0.05 M. The upper limit is determined solely by the solubility of the agent. Concentrations up to 1.0 M and 1.5 M have been used, but without commensurately increased improvement as compared to solutions with lower concentrations. Other useful developer solutions are disclosed in British Pat. Specification No. 1,468,747 and U.S. Pat. No. 3,891,438. The development action can be carried out in more than one step wherein an alkali bath is first used to remove the soluble photoresist and then an acid-containing oxidizer solution such as ferric chloric is used to attack and dissolve the unprotected metal in image-wise fashion.

The stripping layer can be any material which has marginal adhesion to the support layer in the second layered structure under a dry or wet environment and/or photosensitive resist layer and which is readily soluble in the developing solution. Stripping materials include, but are not limited to, maleic anhydride copolymers with, for example, styrene, ethylene, or polyvinyl ether, such as hydrolyzed or lower alkyl ($C_1$ to $C_5$)-esterified forms of poly(methyl vinyl ether/maleic anhydride) which are a class of compounds commercially available under the name Gantrez ™ (GAF ® Corp.), polyvinylpyrrolidone (PVP), PVP copolymers with, for example, vinyl alcohol, poly(vinyl alcohol), or boehmite. The stripping layer is coated by any method known in the art, e.g., bar coating, knife coating, extrusion die, and generally has a dry thickness in the range of 12.5 to 50 micrometers.

Additional optional layers may be present between the metal layer and the photosensitive, photoresist layer. These polymeric layers may serve the purpose of protecting the metal layer from abrasion during the vapor-coating operation or during subsequent coating procedures, or these layers may provide priming from the metal to the photosensitive layers. Such a protective and/or priming layer includes vapor-coated layers and disclosed in U.S. Pat. No. 4,268,541 or solvent-coated layers as disclosed in U.S. Pat. No. 4,230,770. Such layers may contain pigments or dyes, including antihalations dyes.

The present invention allows intermixing of negative and positive photoresist layers in providing a final composite microform article, the various resulting images not necessarily being in the same phase. It permits writing over or eliminating portions of a prior image as well as adding-on a new image. The images are of archival quality as are desirable for information storage, for example, in banks and insurance companies. These images have a protective resist coating on them, and can be handled in roomlight or bright sunlight.

Objects and advantages of this invention are further illustrated by the following examples, but the particular materials and amounts thereof recited in these examples, as well as other conditions and details, should not be construed to unduly limit this invention.

EXAMPLE 1

A photosensitive sheet consisting of a polyester base (102 micrometers) vapor coated with a layer of 700 Å of aluminum and an additional layer of 65 Å of terephthalic acid was coated with positive acting photosensitive resist prepared by mixing the following components at room temperature:

| | |
|---|---|
| methyl ethyl ketone | 27.6 |
| phenol/formaldehyde resin (Resinox TM, Monsanto Company) | 11.0 |
| 2,4,6-tris(dimethylaminomethyl)phenol | 0.23 |
| aliphatic (approximately 36 carbon atom bridging group) diisocyanate (DDI TM-1410, General Mills Chemicals, Inc.) | 1.00 |

The solution containing the above components was mixed until the solution viscosity (measured with a conventional Brookfield viscometer with a No. 2 spindle) stabilized at about 17 centipoise, after which the following were added:

| | |
|---|---|
| methyl ethyl ketone | 11.0 |
| diglycidyl ether of bisphenyl A having an epoxy equivalent weight of 186 to 192, (DER TM 331, Dow Chemical Company) | 3.31 |
| phthalic anhydride | 0.26 |
| diaminodiphenylsulfone | 0.13 |
| 1,2-naphthoquinone diazide-5-p-tert-butylphenylsulfonate | 3.6 |

After thorough mixing, the solution was knife coated (2.5 micrometers thick) onto the thin aluminum layer, the photosensitive coating was then dried at 180° F. for 4 minutes. During drying, the epoxy resin was cured.

The article was exposed to a micrfiche target on a Berkey Ascor 2KW UV source (1 meter from film plane) for 15 seconds and developed in a commercial ENCO Naps developing machine having a developer solution therein containing 0.3 M sodium hydroxide, 0.1 M sodium carbonate, 5 percent sulfonated dodecyldiphenyl ether as surfactant, and 0.1 mole ethylenediaminetetraacetic, acid as the sole chelating agent. Other developing solutions disclosed in U.S. Pat. No. 4,314,022, incorporated herein by reference, are also preferred. An archival aluminum image was formed. The unexposed resist layer remained on the unused portion of this film. After image inspection and room handling (50 ft. candles) for several days, the unused photoresist layer was removed from the primary image layer by methyl ethyl ketone. Another film (secondary image layer) consisting of a flexible base of a Gantrez stripping layer and a photosensitive layer similar to the resist described above, was heat laminated onto the now cleaned primary image layer. The laminated film covered the total film surface including the first image. The temporary support was stripped off the secondary layer leaving a new resist layer on the primary image film. The regenerated primary resist film was exposed and an image developed in the same sequence as previously described.

Both images were of archival quality and had a transmission optical density of greater than 3.0. Repetition of the process (washing the unused photoresist away and laminating another secondary image layer) resulted in an additional image of archival quality being added to the microfilm article.

EXAMPLE 2

A 120 micrometer thick (4 mil) polyester (transparent) film was vapor-coated using the process of U.S. Pat. No. 4,387,156 so that this layer appeared black when viewed directly from above and shiny aluminum when viewed through the polyester base. It had a transmission optical density of 3.27.

Onto this base a negative-acting photoresist was coated using a #10 Mayer bar. The layer consisted of a 10 g solution of a 14 percent solids (methyl ethyl kentone solvent) solution of:

0.40 g of butyl methylacrylate and methyl methacrylic acid copolymer 80/20

0.80 g of hydantoin hexaacrylate monomer (prepared as in U.S. Pat. No. 4,249,011, Ex. 1)

0.03 g of VYHH, 86/14 copolymer of vinyl chloride/vinyl acetate (Union Carbide Co.)

0.05 g of Michler's ketone 0.10 g of diphenyl iodonium salt of $BF_6$

A discrete area of the article was exposed to a microfiche target in a Scott Microprinter, Mode 716, for 1.2 seconds and developed using the following method and materials:

10 seconds, tap water, ambient temperature, spray applied;

45 seconds, immersion in a 20 weight percent solution triethylamine; and 15 seconds, immersion of 0.025 molar solution of sodium hydroxide and washed in running water, then dried.

A black colored replica of the opposite phase (negative-acting) of the original microfiche was observed.

Later, after handing in daylight, and inspection, and viewing in a 3M Reader Printer, a second image was applied to a second discrete area of the article using the following method: A solution of methyl ethyl ketone was used to wash off the residual protective resist layer; then, a secondary layer, identical to that in EXAMPLE 1 was applied by heat lamination onto the entire microfiche to be re-imaged as in EXAMPLE 1. After stripping off the base from the composite, the primary image film (originally negative-acting) now having a positive-acting photosensitive resist layer was exposed in the same device as previously with an exposure time of 3.8 seconds. This was followed by a development step as described in EXAMPLE 1. After development and drying both positive and negative images were seen in the final composite.

Various modifications and alterations of this invention will become apparent to those skilled in the art without departing from the scope and spirit of this invention, and it should be understood that this invention is not to be unduly limited to the illustrative embodiments set forth herein.

I claim:

1. A method of forming a composite image in an imaging material having first and second layered structures, said method comprising:
   a. providing a first layer structure comprising:
      1. a flexible support,
      2. a vapor-deposited metal layer having a conductivity in the range of 0.28 to 1.20 ohms/$cm^2$ and a thickness in the range of 10 to 800 Å on at least one surface of said support, and 3. a non-silver-containing positive- or negative-acting photosensitive, photoresist layer overlying said metal layer,
b. imagewise exposing said photosensitive photoresist layer, in a discrete area, to radiant energy,
c. developing said first layered structure in a developer sequence to provide a positive or negative image of metal and photoresist, said metal image being of archival quality, said image being protected by photoresist material,
d. washing said imaged first layered structure with solvent to remove remaining imagewise exposed areas of negative-acting photoresist material or imagewise unexposed areas of positive-acting photoresist material,
e. providing a second layered structure comprising in sequence:
  1. a non-silver-containing positive- or negative-acting photosensitive, photoresist layer,
  2. a stripping layer, and
  3. a flexible support,
f. laminating said second photosensitive layered structure to said first imaged layered structure, said first imaged layer and said second photosensitive photoresist layer being adjacent to each other,
g. stripping said flexible support from said photosensitive photoresist layer of said second layered structure,
h. imagewise exposing said second photosensitive, photoresist layer, in a discrete area, to radiant energy, and
i. developing said second photosensitive photoresist layer in a developer solution to provide a composite positive or negative image of metal and photoresist, said metal image being of archival quality, said metal image being protected by photoresist material, wherein said metal image of step c. and step i. are in the same layer, said photosensitive, unexposed areas of negative-acting photoresist layers and said imagewise exposed areas of positive-acting photoresist layers and said metal layer being soluble in said developer solutions and at least one of said developer solutions has a pH of at least 12.5.

2. The method according to claim 1 wherein said support is selected from polyester, polyethylene, polyester coated paper, polyester coated filled paper, polystyrene, polypropylene, and cellulose acetates.

3. The method according to claim 1 wherein said vapor-deposited metal layer has a thickness in the range of 50 to 350 Å.

4. The method according to claim 1 wherein said vapor-deposited metal layer has a thickness in the range of 150 to 350 Å.

5. The method according to claim 1 wherein said vapor-deposited metal layer is selected from metals, metal alloys, metal salts, metal compounds, and metalloids.

6. The method according to claim 5 wherein said metal layer is aluminum.

7. The method according to claim 1 wherein said positive- or negative-acting photosensitive, resist layers of said first and second layered structures comprise materials selected from diazonium salts or resins, ethylenically-unsaturated photopolymerizable systems, and acrylic and methacrylic polymerizable systems.

8. The method according to claim 1 wherein said radiant energy is selected from electromagnetic radiation and particle beam energy.

9. The method according to claim 1 wherein said developer solution further comprises at least one of a chelating agent and an oxidizing agent.

10. The method according to claim 1 wherein said developer solution comprises a solvent selected from water, water/alkali solution, water/alcohol, and organic solvents.

11. The method according to claim 1 wherein said stripping layer comprises a material selected from copolymers of maleic anhydride with styrene, ethylene, or polyvinyl ether, polyvinylpyrrolidone or copolymers thereof, poly(vinyl alcohol), and boehmite.

12. The method according to claim 11 wherein said polymer of maleic anhydride is selected from hydrolyzed or lower alkyl ($C_1$ to $C_5$)-esterified forms of poly(methyl vinyl ether/maleic anhydride).

13. The method according to claim 1 wherein said first or second imaged layer is washed with solvent selected from low molecular weight alcohols and ketones to remove said resist layer from said image.

14. The method according to claim 1 further comprising, in said first layered structure, a priming or protective layer between said vapor-deposited metal layer and said photosensitive, photoresist layer.

15. The method according to claim 14 wherein said protective layer further comprises a dye or pigment.

* * * * *